United States Patent [19]

Powell et al.

[11] 3,956,032

[45] May 11, 1976

[54] PROCESS FOR FABRICATING SiC SEMICONDUCTOR DEVICES

[75] Inventors: J. Anthony Powell; Herbert A. Will, both of N. Olmsted, Ohio

[73] Assignee: The United States of America as represented by the United States National Aeronautics and Space Administration, Washington, D.C.

[22] Filed: Sept. 24, 1974

[21] Appl. No.: 508,784

[52] U.S. Cl. .............................. 148/175; 156/610; 156/612; 156/613; 252/62.3 C; 423/345; 423/346
[51] Int. Cl.² ................. H01L 21/205; C01B 31/36
[58] Field of Search ............... 148/175; 252/62.3 C; 156/610, 612, 613; 423/345, 346

[56] References Cited
UNITED STATES PATENTS

| 3,386,866 | 6/1968 | Ebert et al. ........................... 148/175 |
| 3,458,779 | 7/1969 | Blank et al. ........................ 148/175 X |
| 3,501,356 | 3/1970 | Chu ..................................... 148/175 |
| 3,527,626 | 9/1970 | Brander ........................... 252/62.3 C |

OTHER PUBLICATIONS

Powell et al., "Crystal Growth of 2H Silicon Carbide," J. Applied Physics, Vol. 40, No. 11, Oct. 1969, pp. 4660–4662.
Campbell et al., "Epitaxial Growth of Silicon Carbide .... Technique," J. Electrochem. Soc., Vol. 113, No. 8, Aug. 1966, pp. 825–828.
Golightly et al., "Some Aspects of Disorder in Silicon Carbide," Mat. Res. Bull., Vol. 4, 1969, pp. 5119–5128.
Knippenberg et al., "Growth Mechanisms of Silicon Carbide .... Deposition," Textbook –Silicon Carbide–1973, Ed., Marshall et al., pp. 92–107.
Weiss et al., "Chemically Vapor Deposited SiC .... Applications," Textbook–Silicon Carbide–1973, Ed., Marshall et al., pp. 80–91.
Bartlett et al., "Epitaxial Growth of β-Silicon Carbide," Mat. Res. Bull., Vol. 4, 1969, pp. 5341–5354.
Todkill et al., "Properties of Some SiC Electroluminescent Diodes," Ibid., Vol. 4, 1969, pp. 5293–5302.
Liebmann, W. K., "Orientation of Stacking Faults .... in β-SiC," J. Electrochem. Soc., Vol. 111, No. 7, July 1964, pp. 885–886.

Primary Examiner—L. Dewayne Rutledge
Assistant Examiner—W. G. Saba
Attorney, Agent, or Firm—N. T. Musial; J. A. Mackin; J. R. Manning

[57] ABSTRACT

Sections are cut from a SiC platelet such that the sections have a-faces parallel to the c-axis of the SiC platelet. The sections serve as substrates for the growth of SiC layers by attaching the substrates to a body which is then placed in a chamber and the chamber evacuated. Hydrogen is then admitted, and the body on which the substrates are mounted is heated to produce a temperature profile such that the subsequent admission of a carbon containing chlorosilane gas or a mixture of a chlorosilane gas and a hydrocarbon gas will cause free silicon to be deposited at one end of the body while SiC crystals grow on the substrates which are in a preferred temperature range. Dopant gases, either p-type or n-type, can be admitted with the chlorosilane or hydrocarbon gas to produce the desired type of semiconductor.

20 Claims, 3 Drawing Figures

PROCESS FOR FABRICATING SIC SEMICONDUCTOR DEVICES

ORIGIN OF THE INVENTION

This invention was made by employees of the United States Government and may be made or used by the Government of the United States without a payment of any royalites thereon or therefore.

BACKGROUND OF THE INVENTION

This invention relates to methods of growing crystals with the desired crystal structure and is directed more particularly to a method of epitaxially growing SiC layers on SiC substrates.

SiC is a semiconductor material which has many advantages over other available semiconductor materials. For example, silicon carbide rectifiers which operated up to 600° C have been fabricated. No known commercially available semiconductor device is capable of operating satisfactorily to such a high temperature. Additionally, SiC has been used to fabricate luminescent diodes which emit a blue light having a wavelength near to the blue end of the visible spectrum. Such diodes are not commercially available at the present time.

In addition to its excellent stability at high temperatures, SiC has a wide-energy bandgap and, consequently, has great commercial potential particularly in the electro-optical semiconductor industry. However, SiC devices are extremely difficult to fabricate because present processes require high temperatures and, due to growth of the crystal materail on a c-face, layers of different type crystal structures or polymorphs are grown. These polymorphs create hereto-junctions which seriously degrade semiconductor performance.

Semiconductor devices having at least one junction of either the p-n type or the n-p type are generally made by growing a single crystal having the desired crystal structure. The single crystal is then used as a substrate and material with the same crystal structure is grown on the substrate by various methods as described below. The material from which the crystal growth is developed may include dopant atoms of various types.

In the well-known Lely process of growing SiC crystals, SiC is first sublimed and then condensed to form single crystals which may if desired be used as substrates. This process requires temperatures in the range of from 2300° to 2800° C. Dopant gases may be added to the sublimed SiC to produce the desired p-n junction.

In another process for fabricating a p-n junction in SiC, dopant atoms are diffused into a SiC substrate at a temperature in the range of from 2150 to 2250° C.

Still another way to grown p-n junctions in SiC is to epitaxially grow doped layers on SiC substrates. This latter process requires temperatures in excess of 1515° C, the usual temperature being in the 1650° to 1750° C range.

All the above-described methods require temperatures in excess of 1500° C. The high temperatures required by all of these processes present a number of disadvantages. First the dopant atoms tend to diffuse and smear out the boundaries between the differently doped regions. It has been foudn that there is a significant diffusion of dopant atoms above the temperature of 1500° C, although below 1500° C there is very little diffusion. This undesirable diffusion increases rapidly as temperature increases. Secondly, the high temperatures required make it difficult to maintain the required degree of system purity because materials used in the apparatus, such as the chamber, become involved in the process.

In growing SiC crystals, the substrate used is normally a single-crystal platelet having a hexagonal crystal structure. In the past these platelets were prepared so that the SiC to be grown on the crystal would grow on the c-face, that is along the c-axis which is perpendicular to the c-face. Because of this previous method of preparing the substrate, many problems resulted as will now be described.

SiC grows in many different crystal polymorphs, each with its own properties. Any one of these polymorphs can grow under apparently identical conditions and are formed by the stacking of silicon-carbon double layers of atoms. Each double layer may be situated in one of three positions. The sequency of stacking determines the particular polymorph structure and the stacking direction is called the crystal c-axis.

There is a cubic structure called $\beta$ SiC as well as many hexagonal and rhombohedral structures which are usually identified as $\alpha$ SiC. The structure of $\beta$ SiC is unstable above 1400° C and the hexagonal polymorph known as 2H SiC is unstable above 400° C. The Lely process usually produces $\alpha$ SiC polymorphs. A polymorph known as 6H SiC is the most commonly produced and is also the most stable of all the SiC polymorphs. The $\alpha$ SiC crystals produced by the Lely process are usually hexagonal platelets with the crystal c-axis perpendicular to the platelet. In all prior epitaxial processes, the epitaxial layer was grown on the large c-face of the hexagonal platelet; that is, in the c-axis direction. In these processes the stacking sequence frequently changes during growth thereby yielding layers of different polymorphs. This layered structure creates heterojunctions which can seriously degrade semiconductor performance, as indicated previously.

OBJECTS OF THE INVENTION

In view of the foregoing, it is an object of the invention to provide a new and novel method for epitaxially growing SiC crystals.

It is another object of the invention to provide an improved method of epitaxially growing SiC crystals on a SiC substrate by a preferred preparation of the substrate.

Another object of the invention is to provide a method for growing SiC crystals epitaxially on SiC substrates at relatively low temperature.

Still another object of the invention is to provide a method of growing SiC semiconductor junctions having well defined boundaries between differently doped regions.

Yet another object of the invention is to provide a method of epitaxially growing SiC crystals in which the possibility that the epitaxial layer will have a layered structure of different polymorphs is minimized.

SUMMARY OF THE INVENTION

In summary, the inventive method specially prepares crystal substrates which are attached to a susceptor body. The susceptor is heated to establish a desired temperature profile and a gas containing the desired elements of the crystal to be grown is passed over the susceptor and the substrates. Dopant gases may be added to the gas containing the elements of the crystal whereby p-n or n-p type junctions may be produced with minimum smearing and with minimization of the possibility of the growing crystal containing more than one type of polymorph.

DESCRIPTION OF A PREFERRED EMBODIMENT

Figure 1:
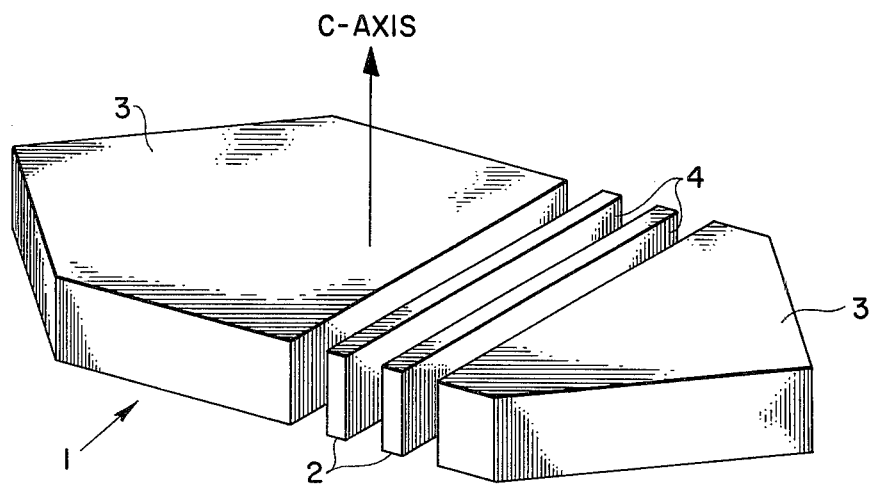
FIG. 1 is a schematic drawing illustrating the manner in which a crystal platelet is sectioned to provide substrates for use with the inventive method.

Referring now to FIG. 1, there is shown a SiC platelet of a 6H type of polymorph having a c-face 3 which is generally perpendicular to the c-axis of the crystal platelet 1. Crystal wafers or sections 2 which will be utilized as substrates in the process to be described are provided by making cuts parallel to the c-axis whereby the crystal sections 2 each has an a-face 4 parallel to the c-axis. As will be described presently, a crystal layer of SiC will be grown on the a-face of each of the crystal sections 2. Preferably, the a-faces of the crystal sections 2 should be polished before the growth of the respective crystal layers thereon is begun. The sections 2 are thin and wafer-shaped and the a-faces may be considered as the fronts while the opposite surfaces, which are also flat, may be referred to as the backs of the sections.

Figure 2:
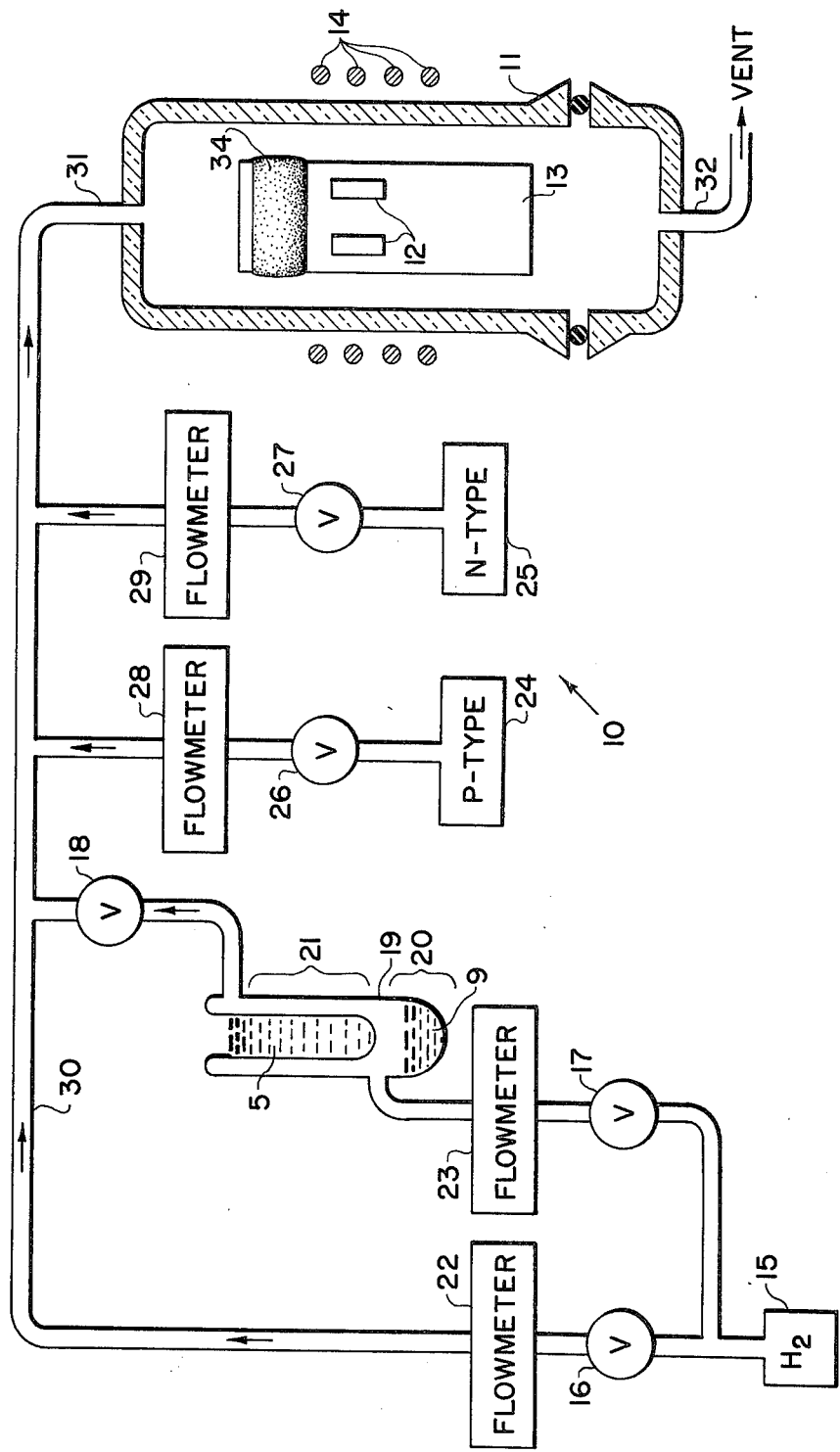
FIG. 2 is a schematic drawing of apparatus utilized in the process of the invention.

Referring now to FIG. 2, apparatus for carrying out the process of the invention is identified by 10. Apparatus 10 comprises by way of example a reaction chamber 11, such as a quartz tube. SiC substrates 12 (sections 2 of FIG. 1) are attached to a vertically oriented graphite susceptor body 13 with the a-faces being exposed by facing outwardly, as shown. The attachment of the substrates may be made mechanically or with a suitable adhesive. The most suitable adhesive has been found to be a solution of carbonized sugar.

To the end that the susceptor 13 will be heated in such a manner that the temperature at its upper end is less than 1,200° C and at least 1,400° C at some point along the susceptor to produce a desired temperature profile, a radio frequency (RF) induction coil 14 is disposed around chamber 11. The RF field produced by coil 14 heats the graphite susceptor such that the temperature at each end is less than 1,200° while the temperature in the middle of the susceptor is about 1,400° C.

A source of hydrogen gas 15 provides a carrier gas which is directed through a valve 16, a flowmeter 22 and a manifold 30 to a port 31 in the top of chamber 11 to purge the chamber after it has been outgassed and evacuated, as will be described presently.

The vent 32 in the bottom of chamber 11 allows unused gases to escape as the process proceeds. A carbon containing chlorosilane liquid 9 which is preferably methyltrichlorosilane ($CH_3SiCl_3$) is contained in the bottom portion 20 of a saturator 19. The methyltrichlorosilane is a liquid which vaporizes at normal room temperature. When the valve 17 is opened, hydrogen flows from the hydrogen source 15 through valve 17, the flowmeter 23, the saturator 19, a valve 18 and the manifold 30 to the port 31 of chamber 11 carrying the vaporized methyltrichlorosilane with it into the reaction chamber 11.

The upper portion 21 of saturator 19 may be cooled to a temperature of about 0°C plus or minus 10°C to condense some of the methyltrichlorosilane whereby it drips back into the lower portion 20 of saturator 19. The valves 16 and 17 are adjusted to provide the desired concentration of methyltrichlorosilane gas in the hydrogen flow.

Where a p-n or n-p type junction is to be formed between the substrate and the crystal layer grown thereon, an n-type or p-type, as desired, dopant gas must be added to the mixture of hydrogen and methyltrichlorosilane being directed to chamber 11. To this end there are provided respective p-type and n-type dopant gas sources 24 and 25 which may direct dopant gas into manifold 30 through respective valves 26, 27 and flowmeters 28, 29.

A typical example of the epitaxial growth of a SiC crystal layer on SiC crystal substrate by the inventive method will now be described. Substrates 12 having at least one a-face are provided by cutting a SiC platelet 1 into sections as shown in FIG. 1. The a-faces of the crystal sections are polished by any one of the techniques known in the art and the crystal sections are attached to an elongated graphite susceptor body which is then disposed in reaction chamber 11 shown in FIG. 2. The polished a-faces face outwardly.

The susceptor and substrates are outgassed by evacuating the chamber to a vacuum of about $10^{-5}$ Torr for several hours. Hydrogen is then admitted to chamber 11 by opening valve 16 and the susceptor is heated by energizing the coil 14 with radio frequency current. As explained previously, the temperature profile from the top to the bottom of susceptor 13 is such that the temperature at the top of the susceptor is less than 1200° C while the temperature in the region of the substrates is in the range of from 1320° to 1390° C.

The hydrogen flow and the temperature profile are maintained until temperature stability of the apparatus, particularly the chamber 11, is attained. This normally takes about one half hour but, of course, depends upon the size of the chamber 11 and the material from which it is made.

The growth of the layer of crystal SiC on the substrates 12 is initiated by opening valve 18 whereby additional hydrogen mixed with methyltrichlorosilane goes through manifold 30 and port 31 into chamber 11. Preferably, the valves 16, 17 and 18 are adjusted such that the concentration of methyltrichlorosilane ranges from about 0.25 to 0.40 molar percent in a total hydrogen flow of 800 to 1,800 cubic centimeters per minute. With these gas flow parameters and the temperature profile across the susceptor, as described previously, epitaxial layers of SiC will grow at rates of from about 0.3 to 0.4 micrometer per minute.

If the crystal being grown is to be doped, one of the other of valves 26 or 27 should be opened to direct a dopant gas from one of the other sources 24 or 25 into chamber 11. Commonly used p-type dopand gases include $AlCl_3$ or $B_2H_6$. Suitable dopant gases of the n-type include $N_2$ or $PH_3$.

As shown in FIG. 2, the a-faces of the substrates 12 are generally vertically oriented and the susceptor 13 and the chamber 11 are also vertically oriented with respect to their elongated configurations. With this arrangement, a large radial temperature gradient exists in the direction from the center of substrate 13 to the wall of chamber 11 causing thermal convection currents in the gas mixture in reaction chamber 11. Advantageously, these convection currents cause the gaseous reaction products, mainly hydrogen chloride, to impinge on the substrates 12, thereby effecting an etching process which takes place continuously and simultaneously with the deposition of SiC on the substrates 12. This action increases surface mobility of the atoms being deposited and results in more uniformly structured epitaxial layers.

Figure 3:
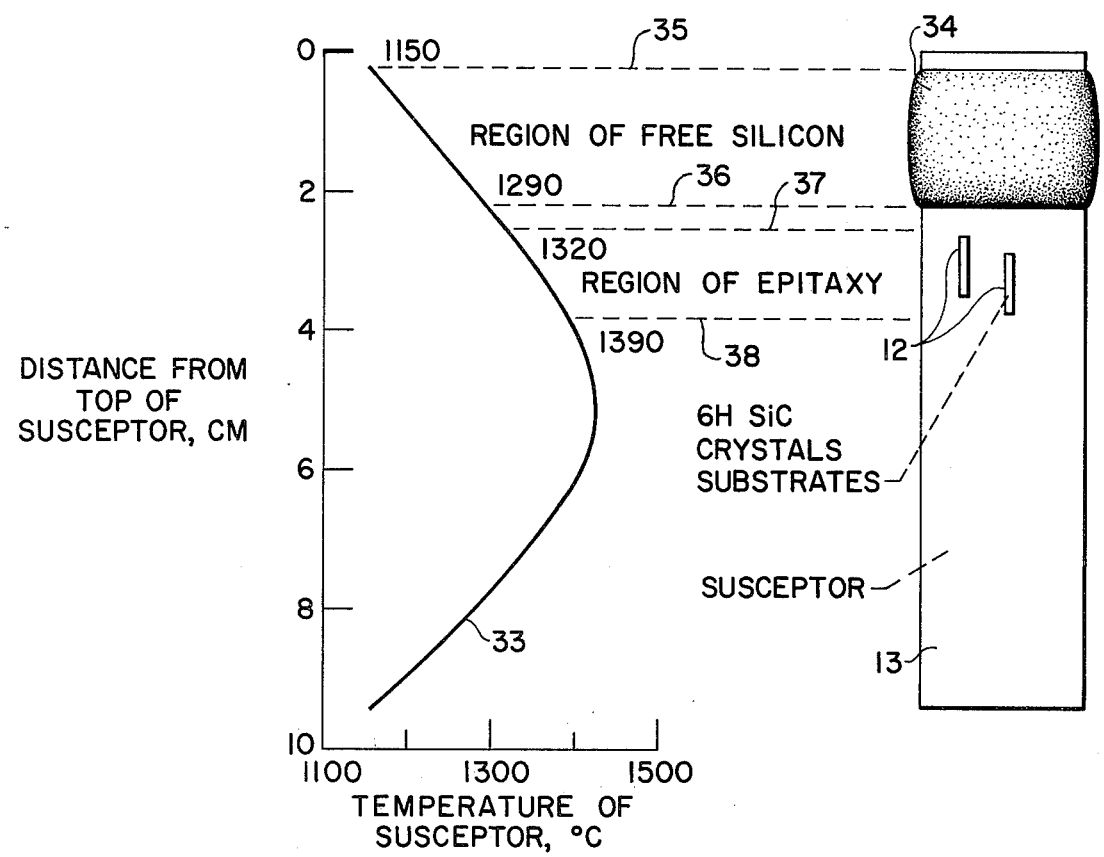
FIG. 3 is a graph illustrating a temperature profile utilized to grow desirable crystal structures in accordance with the invention.

Referring now to FIG. 3, there is shown a curve 33 which represents the temperature profile along the susceptor body 13 in the exemplary process described above. The layer of free silicon 34 forms at the upper end of susceptor 13 in the region where the temperature ranges from about 1150° C as indicated by dashed line 35 and 1290° as represented by dashed line 36. The SiC crystal growth on substrates 12 occurs in the region where the temperature is between 1320° C as represented by dashed line 37 and 1390° C as indicated by dashed line 38. As indicated by curve 33, the temperature decreases to less than 1200° C at the lower end of susceptor 13.

When the mixture of hydrogen and methyltrichlorosilane enters the chamber 11, free silicon is deposited at the upper end of susceptor 13 as a layer 34. This takes place in the region where the temperature ranges from about 1150° C to about 1290° C. This deposition of free silicon is believed to aid in the growth of the single polymorph SiC crystal although the mechanism is not fully understood.

While the chamber 11, the substrates 12 and the susceptor 13 are shown in FIG. 2 as being vertically oriented, a horizontal orientation will work satisfactorily. However, with the horizontal orientation there is less turbulence or convection of the reaction gases and, accordingly, to obtain ample etching of the substrate surfaces, HCl gas may be injected into the reaction chamber 11.

With regard to the gas which is admitted to chamber 11 with the hydrogen carrier gas, methyltrichlorosilane is preferred. However, any of the general class of chlorosilane gas may be utilized provided it contains adequate carbon atoms. Furthermore, chlorosilane gas containing no carbon atoms may be used if a hydrocarbon gas is mixed therewith.

The temperature gradient profile curve 33 shown in FIG. 3 is that which results from the apparatus shown in FIG. 2 wherein RF coils 14 are disposed around the reaction chamber 11. However, it is not essential that the temperature profile increase from about 1,150° C at the upper end of susceptor 13 to about 1,400° and then decrease again to less than 1200° at the lower end. For example, the coils 14 of FIG. 1 might be sized and positioned so that the temperature profile increases from less than 1200° C at the upper end of susceptor 13 to about 1400° C at the lower end. The requirement for the inventive method is that there be a temperature range of from about 1200° to about 1300° to cause the deposition of free silicon on the susceptor and another range of about 1300° to 1400°C to provide a temperature range wherein a single polymorph of 6H SiC crystal is grown on the SiC substrate.

The temperature profile, as discussed above, may be achieved by means other than RF induction coils 14. For example, lenses and reflectors, as shown in U.S. Pat. No. 3,427,435, could be used to focus heat rays from an infrared source on a portion of susceptor 13.

Also, arrangements of lenses and reflectors could be used to concentrate solar rays in the reaction chamber 11. Additionally, if the substrate 13 is SiC, an electric heating element could be disposed therein to provide the desired temperature profile.

While the method of the invention and the apparatus have been described with relatively great detail, it will be understood that those skilled in the art of growing crystals may make changes and modifications to the foregoing method without departing from the spirit and scope of the invention as set forth in the claims appended hereto.

What is claimed is:

1. A method for epitaxially growing SiC having at least one face substantially parallel to the crystal c-axis;
    providing an elongated susceptor of a material which is substantially inert below a temperature of 2000° C and having a first end and a second end;
    attaching said substrate to said susceptor between said first and second ends;
    disposing said elongated susceptor and attached substrate in an elongated chamber;
    passing hydrogen over said one face of said substrate;
    heating at least a portion of said susceptor to establish a temperature gradient between said first and second ends; and
    passing a gas mixture comprised of hydrogen and a carbon containing chlorosilane over said susceptor and said substrate in a direction from said first end toward said second end, said temperature gradient being such that free silicon is deposited in a band at said first end of said susceptor and crystal growth on said substrate is effected.

2. The method of claim 1 wherein the temperature gradient on said susceptor is produced by subjecting at least a portion of said susceptor to a high frequency magnetic field.

3. The method of claim 1 wherein said susceptor is graphite.

4. The method of claim 3 wherein a coating of SiC is applied to said susceptor before said substrate is attached.

5. The method of claim 1 wherein said susceptor is a refractory metal.

6. The method of claim 5 to wherein a coating of SiC is applied to said susceptor before said substrate is attached.

7. The method of claim 1 wherein said elongated susceptor and attached substrate are disposed with said first end up in an elongated vertically oriented chamber having a top with a port for admitting said gas and a bottom with a vent port, said face of said substrate being generally vertically oriented.

8. The method of claim 1 wherein said face of said substrate is polished prior to attaching to said susceptor.

9. The method of claim 1 wherein said mixture of gas includes a p-type dopant gas.

10. The method of claim 9 wherein said p-type dopant gas is selected from the group consisting of $AlCl_3$ and $B_2H_6$.

11. The method of claim 1 wherein said mixture of gas includes an n-type dopant gas.

12. The method of claim 11 wherein said n-type dopant gas is selected from the group consisting of $N_2$ and $PH_3$.

13. The method of claim 1 wherein said mixture includes a concentration of 0.25 to 0.40 molar percent $CH_3SiCl_3$ as the chlorosilane gas.

14. The method of claim 1 wherein the total $H_2$ flow is from about 800 to 1800 cc per minute.

15. The method of claim 1 wherein said susceptor is SiC.

16. The method of claim 1 including the step of adding HCl gas to the mixture being passed over the substrates.

17. The method of claim 1 wherein said gas mixture is comprised of hydrogen and methyltrichlorosilane.

18. The method of claim 1 wherein said gas mixture is comprised of hydrogen, a chlorosilane gas and a hydrocarbon gas.

19. The method of claim 1 wherein the teperature gradient is such that the temperature at said first end is less than 1200° C and no greater than 1400° C at said second end.

20. The method of claim 19 wherein said at least one substrate is positioned on said susceptor in a region where the temperature range is between about 1320° C and 1390° C.

* * * * *